(12) United States Patent
Ozaki et al.

(10) Patent No.: US 10,084,059 B2
(45) Date of Patent: Sep. 25, 2018

(54) SEMICONDUCTOR DEVICE AND MANUFACTURING METHOD OF SEMICONDUCTOR DEVICE

(71) Applicant: FUJITSU LIMITED, Kawasaki-shi, Kanagawa (JP)

(72) Inventors: Shirou Ozaki, Yamato (JP); Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 73 days.

(21) Appl. No.: 15/497,845

(22) Filed: Apr. 26, 2017

(65) Prior Publication Data

US 2017/0373168 A1    Dec. 28, 2017

(30) Foreign Application Priority Data

Jun. 23, 2016  (JP) .................. 2016-124440

(51) Int. Cl.
| | |
|---|---|
| *H01L 31/036* | (2006.01) |
| *H01L 29/66* | (2006.01) |
| *H01L 21/02* | (2006.01) |
| *H01L 21/28* | (2006.01) |
| *H01L 29/20* | (2006.01) |
| *H01L 29/205* | (2006.01) |
| *H01L 29/778* | (2006.01) |

(52) U.S. Cl.
CPC .... *H01L 29/66462* (2013.01); *H01L 21/0214* (2013.01); *H01L 21/0223* (2013.01); *H01L 21/02178* (2013.01); *H01L 21/02252* (2013.01); *H01L 21/28264* (2013.01); *H01L 29/2003* (2013.01); *H01L 29/205* (2013.01); *H01L 29/7787* (2013.01)

(58) Field of Classification Search
CPC .......... H01L 29/66462; H01L 21/0214; H01L 21/0217; H01L 29/2003; H01L 29/205; H01L 29/7787
See application file for complete search history.

(56) References Cited

U.S. PATENT DOCUMENTS

| | | | |
|---|---|---|---|
| 2010/0044752 A1 | 2/2010 | Marui | |
| 2011/0318913 A1 | 12/2011 | Ikeda et al. | |
| 2016/0126494 A1* | 5/2016 | Jung | .................. H01L 27/3258 257/72 |

FOREIGN PATENT DOCUMENTS

| | | |
|---|---|---|
| JP | 2002-359256 | 12/2002 |
| JP | 2010-050347 | 3/2010 |
| JP | 2010-118556 | 5/2010 |
| JP | 2012-174804 | 9/2012 |

* cited by examiner

*Primary Examiner* — Elias M Ullah
(74) *Attorney, Agent, or Firm* — Fujitsu Patent Center

(57) ABSTRACT

A semiconductor device includes a first semiconductor layer formed of a nitride semiconductor, on a substrate; a second semiconductor layer formed of a nitride semiconductor, on the first semiconductor layer; a source electrode and a drain electrode formed on the second semiconductor layer; a first insulating film formed on the second semiconductor layer; a second insulating film formed on the first insulating film; and a gate electrode formed on the second insulating film. The first insulating film includes a nitride film formed on a side of the second semiconductor layer, and an oxynitride film formed on the nitride film, and the second insulating film is formed of an oxide.

19 Claims, 16 Drawing Sheets

SEMICONDUCTOR DEVICE AND MANUFACTURING METHOD OF SEMICONDUCTOR DEVICE

CROSS-REFERENCE TO RELATED APPLICATION

This patent application is based upon and claims the benefit of priority of the prior Japanese Patent Application No. 2016-124440 filed on Jun. 23, 2016, the entire contents of which are incorporated herein by reference.

FIELD

The embodiments discussed herein are related to a semiconductor device and a method of manufacturing a semiconductor device.

BACKGROUND

GaN, AlN, and InN, etc., which are nitride semiconductors, or materials made of mixed crystals of these nitride semiconductors, have a wide band gap, and are used as high output electronic devices or short-wavelength light emitting devices. Among these, as high output devices, technologies are developed in relation to field effect transistors (FET), more particularly, High Electron Mobility Transistors (HEMT) (see, for example, Patent Document 1). A HEMT using such a nitride semiconductor is used for high output/high efficiency amplifiers and high power switching devices.

As a field effect transistor using a nitride semiconductor, there is a HEMT in which GaN is used as an electron transit layer and AlGaN is used as an electron supply layer. In the electron transit layer, 2DEG (Two-Dimensional Electron Gas) is generated, by the functions of piezoelectric polarization and spontaneous polarization in GaN. As this kind of HEMT, there is a HEMT having a MIS structure, in which an insulating film is formed on the electron transit layer and a gate electrode is formed on the insulating film. In this way, by forming an insulating film between the gate electrode and the electron supply layer, a gate leakage current can be suppressed.

Patent Document 1: Japanese Laid-Open Patent Publication No. 2002-359256
Patent Document 2: Japanese Laid-Open Patent Publication No. 2012-174804
Patent Document 3: Japanese Laid-Open Patent Publication No. 2010-50347
Patent Document 4: Japanese Laid-Open Patent Publication No. 2010-118556

SUMMARY

According to an aspect of the embodiments, a semiconductor device includes a first semiconductor layer formed of a nitride semiconductor, on a substrate; a second semiconductor layer formed of a nitride semiconductor, on the first semiconductor layer; a source electrode and a drain electrode formed on the second semiconductor layer; a first insulating film formed on the second semiconductor layer; a second insulating film formed on the first insulating film; and a gate electrode formed on the second insulating film, wherein the first insulating film includes a nitride film formed on a side of the second semiconductor layer, and an oxynitride film formed on the nitride film, and the second insulating film is formed of an oxide.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1:
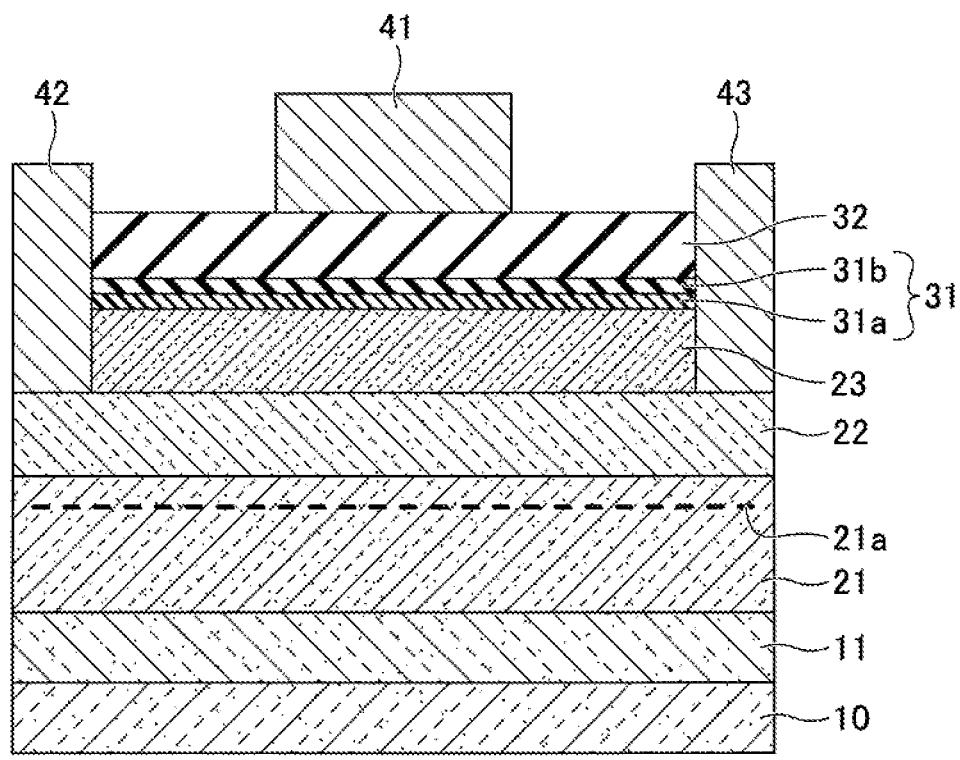
FIG. 1 illustrates a structure of a semiconductor device according to a first embodiment.

In the HEMT of the related art, in order to suppress the gate leakage current, a material having high insulation properties is preferably used as the insulating film formed between the gate electrode and the electron supply layer; preferable materials are an oxide such as aluminum oxide ($Al_2O_3$) and silicon oxide ($SiO_2$), etc., having a wide band gap. However, when an insulating film is formed by an oxide on the electron supply layer formed by a nitride semiconductor, due to the oxygen included in the insulating film, the electron supply layer becomes oxidized, and GaOx, etc., which is an incomplete oxide, is formed from the interface between the electron supply layer and the insulating film. When GaOx, etc., which is an incomplete oxide, is formed as described above, electrons are trapped, and threshold variation increases in the semiconductor device and operations become unstable, and therefore the above semiconductor device is not preferable.

Preferred embodiments of the present invention will be explained with reference to accompanying drawings. Note that the same members are denoted by the same reference numerals, and redundant explanations are omitted.

First Embodiment (Semiconductor Device)

A description is given of a semiconductor device according to a first embodiment. FIG. 1 illustrates a structure of a semiconductor device according to the first embodiment. In the semiconductor device according to the present embodiment, by the epitaxial growth of nitride semiconductors, a buffer layer 11, an electron transit layer 21, an electron supply layer 22, and a cap layer 23 are deposited in a layered manner on a substrate 10. A source electrode 42 and a drain electrode 43 are formed on the electron supply layer 22. On the cap layer 23 between the source electrode 42 and the drain electrode 43, a first insulating film 31 and a second insulating film 32 are sequentially deposited in a layered manner, and a gate electrode 41 is formed on the second insulating film 32. Note that in the present embodiment, the electron transit layer 21 may be referred to as a first semiconductor layer and the electron supply layer 22 may be referred to as a second semiconductor layer.

The substrate 10 is formed of a semiconductor material such as SiC, etc. The buffer layer 11 is formed of AlN and GaN, etc., the electron transit layer 21 is formed of i-GaN, the electron supply layer 22 is formed of n-AlGaN, and the cap layer 23 is formed of n-GaN. Accordingly, in the electron transit layer 21, 2DEG 21a is generated near the interface between the electron transit layer 21 and the electron supply layer 22.

The first insulating film 31 is formed of a layered film in which a $Si_3N_4$ (silicon nitride) film 31a that is a nitride film, and a SiON (silicon oxynitride) film 31b that is an oxynitride film are deposited. The $Si_3N_4$ film 31a and the SiON film 31b are formed in the stated order on the cap layer 23. The second insulating film 32 is formed of $Al_2O_3$, and is formed on the SiON film 31b of the first insulating film 31. Furthermore, the SiON film 31b of the first insulating film 31 has a gradient composition, in which the oxygen concentration gradually decreases from the second insulating film 32 toward the $Si_3N_4$ film 31a, and the SiON film 31b has an amorphous structure. In the present embodiment, the first insulating film 31 has a film thickness of greater than or equal to 3 nm and less than or equal to 20 nm, and the second insulating film 32 has a film thickness of greater than or equal to 2 nm and less than or equal to 100 nm. Furthermore, in the present embodiment, the film thickness of the second insulating film 32 is greater than the film thickness of the first insulating film 31.

The first insulating film 31 may be a layered film in which an AlN film and an AlON film are deposited, other than the layered film in which the $Si_3N_4$ film and the SiON film are deposited. Furthermore, the second insulating film 32 may be formed of $SiO_2$, $HfO_2$ (hafnium oxide), and $Ta_2O_5$ (tantalum pentoxide).

In the present embodiment, on the cap layer 23, the $Si_3N_4$ film 31a of the first insulating film 31 is formed, and $Si_3N_4$ is a nitride. Therefore, the cap layer 23 does not directly contact the oxide film or the oxynitride film. Therefore, n-GaN, which forms the cap layer 23, will not be oxidized.

Incidentally, the band gap of $Si_3N_4$ is approximately 5.3 eV, and the band gap of $SiO_2$ is approximately 9.0 eV. Furthermore, the band gap of AlN is approximately 6.3 eV, and the band gap of $Al_2O_3$ is approximately 8.8 eV. In this way, generally, an oxide has a wider band gap and higher insulation properties, compared to a nitride. In the case of an oxynitride, the band gap is a value between those of an oxide and a nitride; the more the oxidization proceeds, the wider the band gap and the higher the insulation properties. In the present embodiment, the second insulating film 32 is formed of an oxide, and part of the first insulating film 31 is formed of an oxynitride. Therefore, in the present embodiment, the insulation properties are high, and the leakage current is suppressed. Furthermore, the oxynitride film forming the first insulating film 31 has an amorphous structure, and therefore the trapping of electrons is mitigated.

Manufacturing Method of Semiconductor Device

Next, a description is given of the manufacturing method of the semiconductor device according to the first embodiment.

Figure 2A:
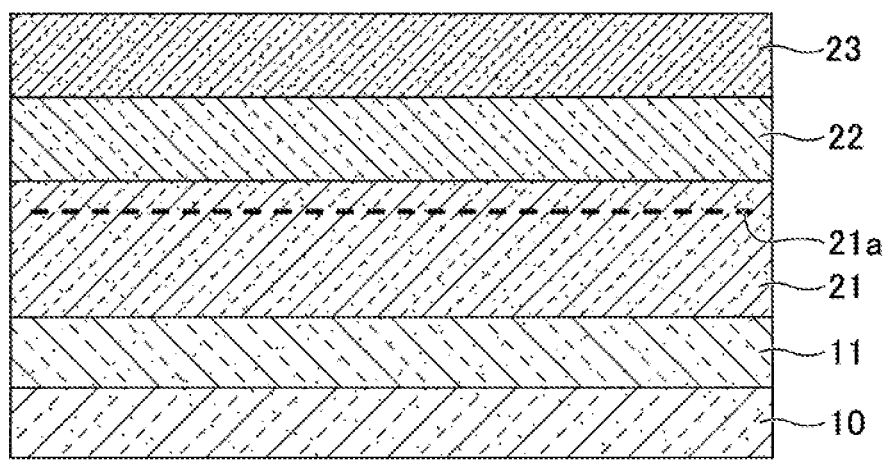
FIGS. 2A and 2B are process drawings of a method of manufacturing the semiconductor device according to the first embodiment.

First, as illustrated in FIG. 2A, by epitaxially growing nitride semiconductor layers, the buffer layer 11, the electron transit layer 21, the electron supply layer 22, and the cap layer 23 are formed on the substrate 10. Accordingly, the 2DEG 21a is generated in the electron transit layer 21, near the interface between the electron transit layer 21 and the electron supply layer 22. The nitride semiconductor layers are formed by epitaxial growth according to MOVPE (Metal Organic Vapor Phase Epitaxy). Note that these nitride semiconductor layers may be formed by MBE (Molecular Beam Epitaxy), instead of by MOVPE.

As the substrate 10, for example, a sapphire substrate, a Si substrate, a SiC substrate, and a GaN substrate may be used. In the present embodiment, a SiC substrate is used as the substrate 10. The buffer layer 11 is formed by AlGaN, etc., the electron transit layer 21 is formed by i-GaN, the electron supply layer 22 is formed by n-AlGaN, and the cap layer 23 is formed by n-GaN.

When these nitride semiconductor layers are formed by MOVPE, TMA (trimethyl aluminum) is used as the raw material gas of Al, and TMG (trimethyl gallium) is used as the raw material gas of Ga. Furthermore, $NH_3$ (ammonia) is used as the raw material gas of N. Furthermore, when doping Si to form an n-type impurity element, $SiH_4$ (silane) is used. Note that these types of raw material gas are supplied to a reacting furnace of a MOVPE device, by using hydrogen ($H_2$) as the carrier gas.

Subsequently, although not illustrated, an element separation area for separating the elements is formed. Specifically, photoresist is applied on the cap layer 23, and exposing and developing are performed with an exposing device to form a resist pattern having an opening in the area where the element separation area is to be formed. Subsequently, argon (Ar) ions are implanted in the nitride semiconductor layer in an area where the resist pattern is not formed, to form the element separation area. The element separation area may be formed by removing a part of the nitride semiconductor layers in an area where the resist pattern is not formed, by dry etching such as RIE (Reactive Ion Etching). After forming the element separation area, the resist pattern is removed with an organic solvent.

Figure 2B:
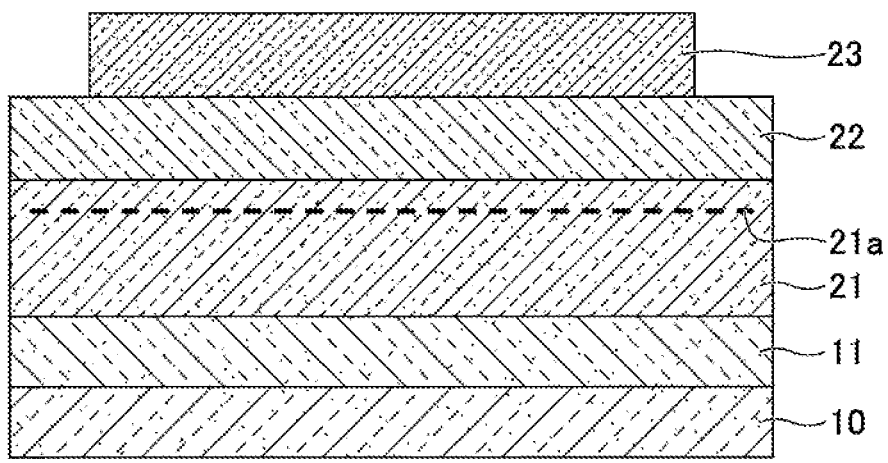

Next, as illustrated in FIG. 2B, the cap layer 23 is removed from the areas where the source electrode 42 and the drain electrode 43 are to be formed. Specifically, photoresist is applied on the cap layer 23, and exposing and developing are performed with an exposing device to form a resist pattern (not illustrated) having openings in the areas where the source electrode 42 and the drain electrode 43 are to be formed. Subsequently, the cap layer 23 in the areas where the resist pattern is not formed, is removed by dry etching with the use of chlorine gas as the etching gas, to expose the electron supply layer 22. At this time, the parts of the electron supply layer 22 in the areas where the source electrode 42 and the drain electrode 43 are to be formed, may also be removed by dry etching.

Figure 3A:
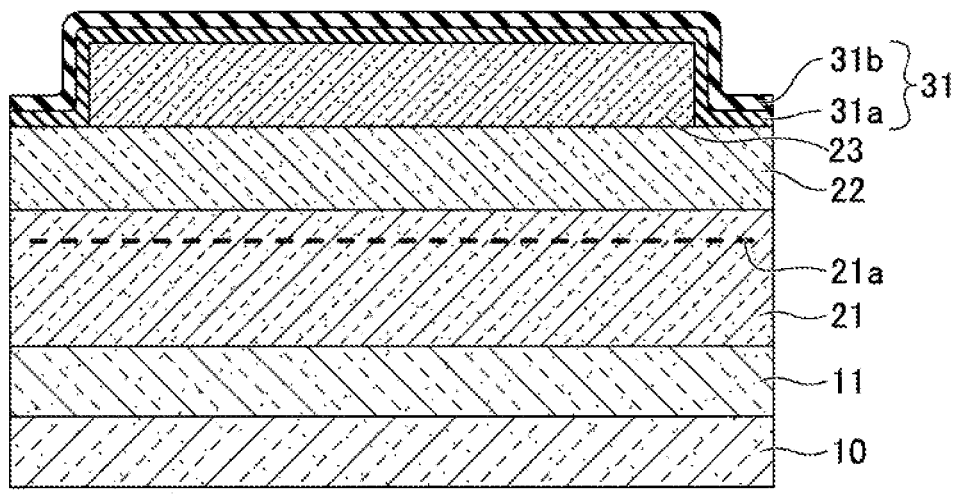
FIGS. 3A and 3B are process drawings of a method of manufacturing the semiconductor device according to the first embodiment.

Next, as illustrated in FIG. 3A, the first insulating film 31 is formed on the cap layer 23. The first insulating film 31 is formed by forming a silicon nitride film on the cap layer 23, and then performing an oxygen plasma process. Specifically, first, a reduction treatment is performed on the surface oxide film in the n-GaN film, etc., forming the cap layer 23, with the use of hydrogen or ammonia ($NH_3$), and then a $Si_3N_4$ film is formed by CVD (chemical vapor deposition). The film thickness of the formed $Si_3N_4$ film is 3 nm through 20 nm; for example, 5 nm. Subsequently, by an oxygen plasma process, the $Si_3N_4$ film is oxidized from the surface, to form the SiON film 31b. The SiON film 31b formed as above is a gradient composition film of SiON, in which the oxygen concentration gradually decreases as the depth increases from the surface.

This oxygen plasma process is performed at, for example, an RF power of 400 W. When a SiN film is oxidized by an oxygen plasma process, SiON is formed up to a depth of approximately 2 nm through 3 nm, and the part contacting the cap layer 23 remains to be $Si_3N_4$. Therefore, the n-GaN film forming the cap layer 23 will not be oxidized. Furthermore, a part of the first insulating film 31 is an oxynitride, and therefore the band gap is wide, the gate leakage current can be suppressed, and also the structure is amorphous, and therefore it is possible to mitigate a defect of electrons being trapped. Note that by steam oxidation or thermal oxidation, it is not possible to oxidize the $Si_3N_4$ film up to a desired depth to form a SiON film, and therefore plasma oxidation is preferable.

Thus, the first insulating film 31 is a film in which the $Si_3N_4$ film 31a that is a nitride film and the SiON film 31b that is an oxynitride film are deposited. The SiON film 31b is a gradient composition film in which the oxygen concentration decreases and the nitrogen concentration increases, from the surface of the SiON film 31b toward the $Si_3N_4$ film 31a. That is, the SiON film 31b in the first insulating film 31 has a concentration gradient in which the oxygen concentration decreases and the nitrogen concentration increases, from the surface of the SiON film 31b toward the $Si_3N_4$ film 31a.

Figure 3B:
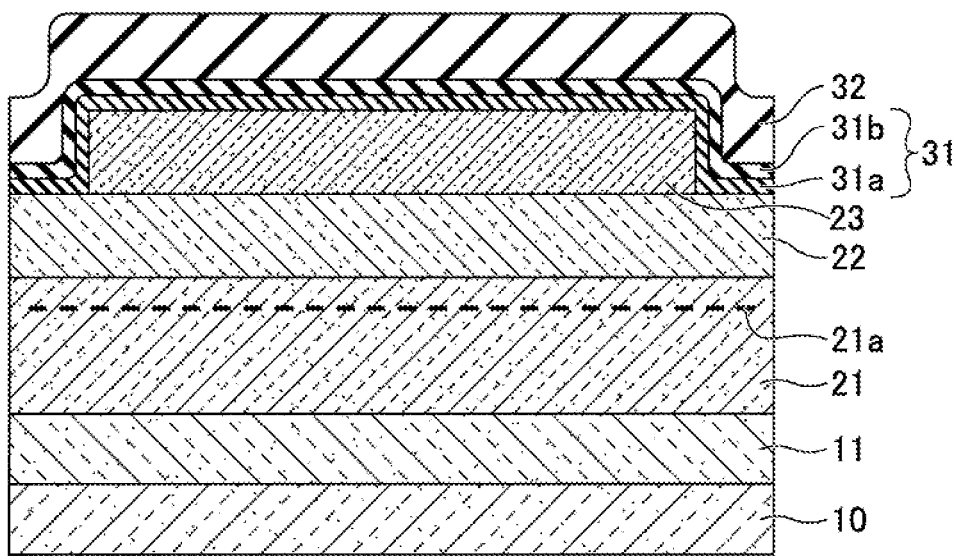

Next, as illustrated in FIG. 3B, an $Al_2O_3$ film having a film thickness of 2 nm through 100 nm, for example, 35 nm, is formed by ALD (Atomic Layer Deposition) on the first insulating film 31, to form the second insulating film 32. The second insulating film 32 is an oxide, and therefore the band gap is wide. In the present embodiment, in order to suppress the gate leakage current, the film thickness of the second insulating film 32 is preferably greater than the film thickness of the first insulating film 31. Subsequently, heat treatment is performed at a temperature of 500° C. through 800° C. The temperature of the heat treatment at this time is higher than the temperature of the heat treatment at the time of causing the source electrode 42 and the drain electrode 43 to come in ohmic contact with each other described below.

Figure 4A:
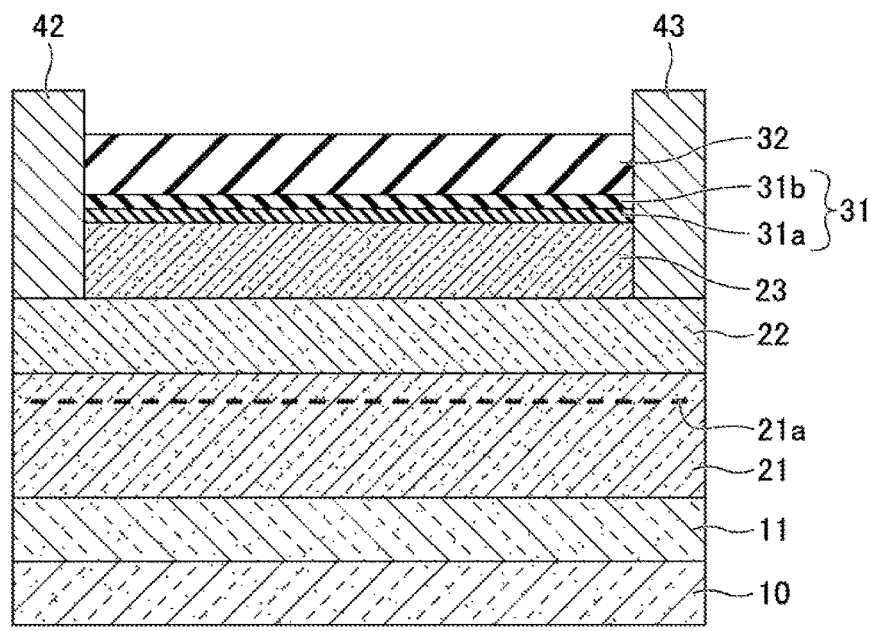
FIGS. 4A and 4B are process drawings of a method of manufacturing the semiconductor device according to the first embodiment.

Next, as illustrated in FIG. 4A, the first insulating film 31 and the second insulating film 32 are removed from the areas where the source electrode 42 and the drain electrode 43 are to be formed, and the source electrode 42 and the drain electrode 43 are formed on the exposed electron supply layer 22. Specifically, a photoresist is applied on the second insulating film 32, and exposing and developing are performed with an exposing device to form a resist pattern (not illustrated) having opening parts in the areas where the source electrode 42 and the drain electrode 43 are to be formed. Subsequently, the first insulating film 31 and the second insulating film 32 are removed from the areas where the resist pattern is not formed by dry etching, to expose the surface of the electron supply layer 22. Subsequently, a metal layered film formed of Ta/Al is formed by vacuum vapor deposition. Subsequently, by immersing this in an organic solvent, the metal layered film formed on the resist pattern is lifted off and removed together with the resist pattern. Accordingly, the source electrode 42 and the drain electrode 43 are formed by the metal layered film remaining on the electron supply layer 22. Subsequently, by performing heat treatment at a temperature of approximately 550° C., the source electrode 42 and the drain electrode 43 are caused to come in ohmic contact with each other.

Figure 4B:
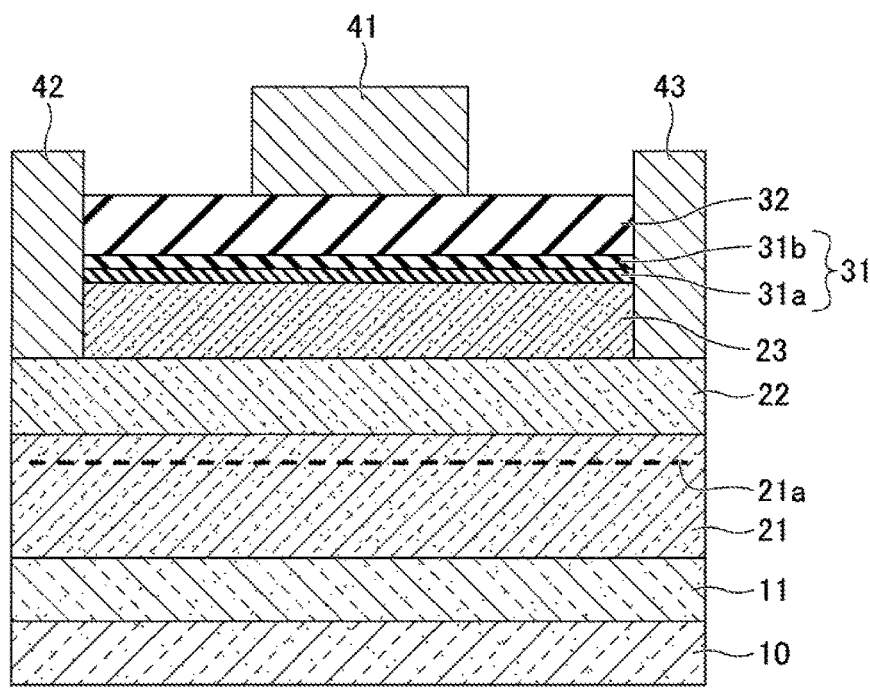

Next, as illustrated in FIG. 4B, the gate electrode 41 is formed on the second insulating film 32. Specifically, a photoresist is applied on the second insulating film 32, and exposing and developing are performed with an exposing device to form a resist pattern (not illustrated) having an opening part in the area where the gate electrode 41 is to be formed. Subsequently, a metal layered film formed of Ni/Au is formed by vacuum vapor deposition. Subsequently, by immersing this in an organic solvent, the metal layered film formed on the resist pattern is lifted off and removed together with the resist pattern. Accordingly, the gate electrode 41 is formed by the metal layered film remaining on the second insulating film 32. Subsequently, heat treatment is performed at a temperature of approximately 300° C. through 400° C., and furthermore, a protection film (not illustrated), etc., is formed with an insulating material.

According to the above processes, the semiconductor device according to the present embodiment is manufactured.

Threshold Variation

Next, a description is given of the threshold variation in the semiconductor device according to the present embodiment. Specifically, a sample 6A illustrated in FIG. 6A corresponding to the conventional semiconductor device illustrated in FIG. 5, and a sample 6B illustrated in FIG. 6B corresponding to the semiconductor device according to the present embodiment, were fabricated, and the C-V properties were measured. The C-V properties were measured by forming an electrode (not illustrated) on each of the sample 6A and the sample 6B and fabricating a MOS diode. In the sample 6A illustrated in FIG. 6A, by epitaxial growth of nitride semiconductors, the buffer layer 11, the electron transit layer 21, the electron supply layer 22, and the cap layer 23 are deposited in a layered manner on the substrate 10, and an insulating film 930 is formed on the cap layer 23. The insulating film 930 is formed of an $Al_2O_3$ having a film thickness of 40 nm, and an electrode (not illustrated) is formed on the insulating film 930. In the sample 6B illustrated in FIG. 6B, by epitaxial growth of nitride semiconductors, the buffer layer 11, the electron transit layer 21, the electron supply layer 22, and the cap layer 23 are deposited in a layered manner on the substrate 10. The first insulating film 31 and the second insulating film 32 are formed on the cap layer 23. The first insulating film 31 has a film thickness of approximately 5 nm, and is formed of the $Si_3N_4$ film 31a and the SiON film 31b. The second insulating film 32 is formed of $Al_2O_3$ having a film thickness of approximately 35 nm. An electrode (not illustrated) is formed on the second insulating film 32.

Figure 7A:
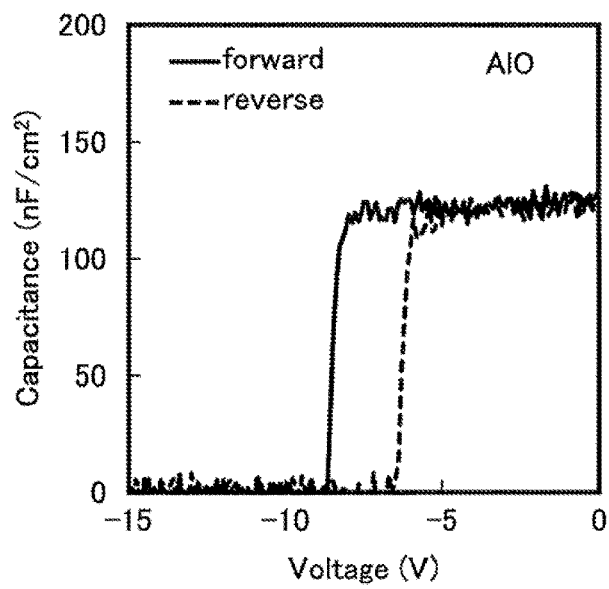
FIGS. 7A and 7B illustrate C-V properties of the samples 6A and 6B.

In the measurement of C-V properties, a voltage was applied to the electrode formed on the insulating film 930 or the second insulating film 32, and the capacitance was measured. The voltage applied to the electrode was first raised from −20 V to 10 V, and then dropped to −20 V. The capacitance measured by this method is the capacitance of the 2DEG 21a in the sample 6A and the sample 6B, and the threshold variation is the variation amount in the threshold at which the capacitance changes, in the case of raising and dropping the applied voltage. FIG. 7A illustrates the C-V properties of the sample 6A corresponding to the conventional semiconductor device, and FIG. 7B illustrates the C-V properties of the sample 6B corresponding to the semiconductor device according to the present embodiment.

Figure 7B:
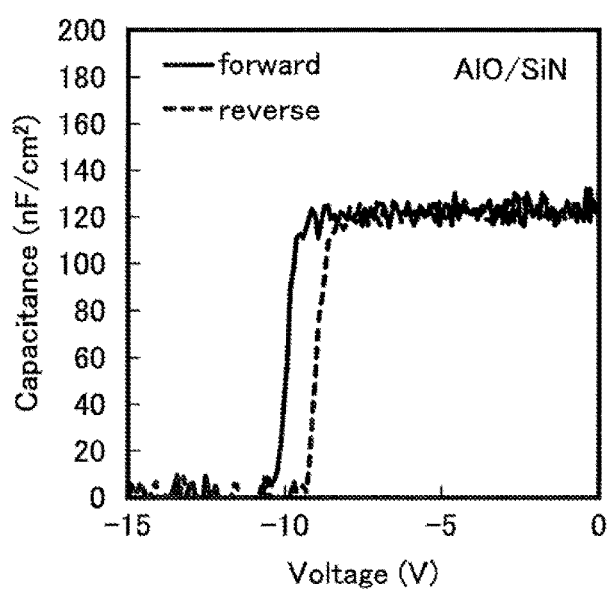
Figure 8:
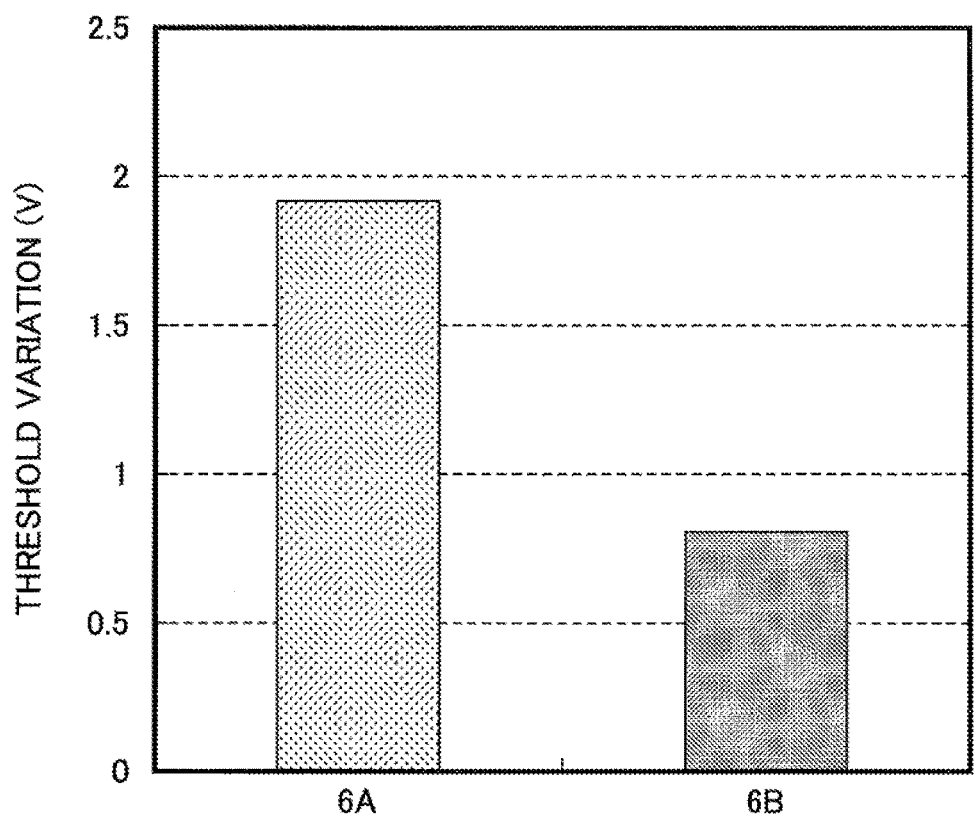
FIG. 8 illustrates the threshold variation in the samples 6A and 6B.

As illustrated in FIGS. 7A and 7B, the threshold variation in the sample 6A corresponding to the conventional semiconductor device was approximately 1.9 V, whereas the threshold variation in the sample 6B corresponding to the semiconductor device according to the present embodiment was approximately 0.8 V. These results are illustrated in FIG. 8. As can be clearly seen from FIGS. 7A through 8, the threshold variation of the semiconductor device according to the present embodiment is less than or equal to half the threshold variation of the conventional semiconductor device illustrated in FIG. 5.

Figure 9:
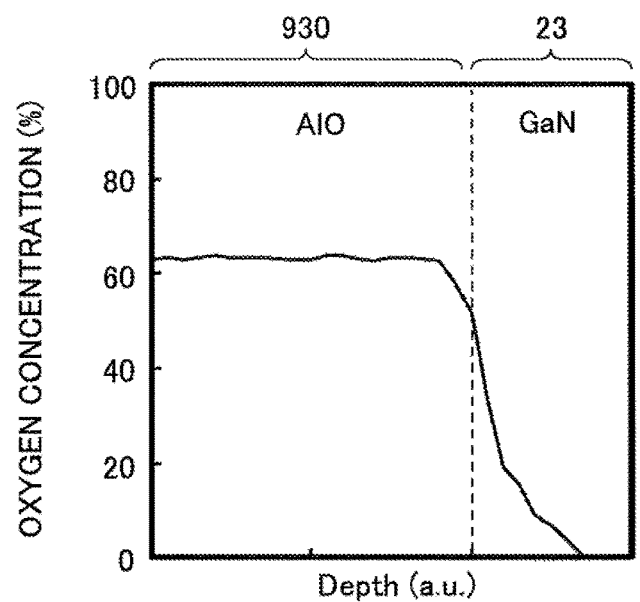
FIG. 9 is illustrates the correlation of the depth and the oxygen concentration of the sample 6A.
Figure 10:
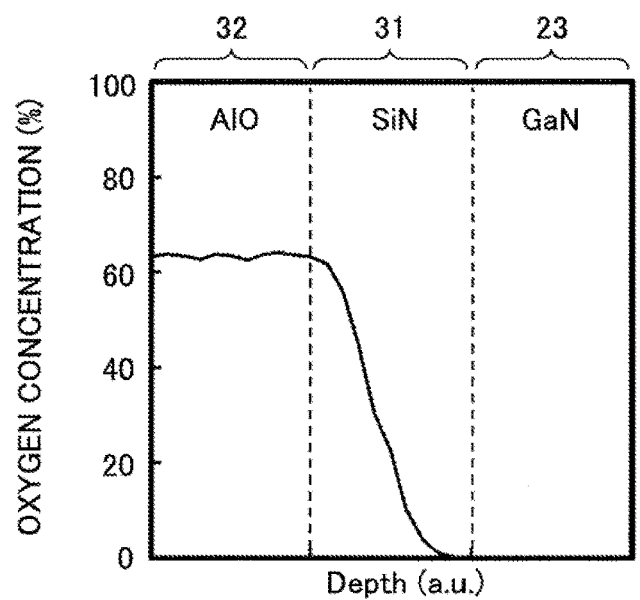
FIG. 10 is illustrates the correlation of the depth and the oxygen concentration of the sample 6B.

Next, in the sample 6A and the sample 6B, the oxygen concentration in the depth direction was measured by XPS (X-ray Photoelectron Spectroscopy). FIG. 9 illustrates the results obtained by measuring the oxygen concentration in the depth direction by XPS in the sample 6A, and FIG. 10 illustrates the results obtained by measuring the oxygen concentration in the depth direction by XPS in the sample 6B.

As illustrated in FIG. 9, in the sample 6A corresponding to the conventional semiconductor device, oxygen has entered into the cap layer 23 from the interface with the insulating film 930, and the cap layer 23 is oxidized on the side of the insulating film 930. On the other hand, as illustrated in FIG. 10, in the sample 6B corresponding to the semiconductor device according to the present embodiment, the first insulating film 31 is not oxidized on the side of the cap layer 23, and remains to be $Si_3N_4$, and the cap layer 23 is not oxidized.

Figure 5:
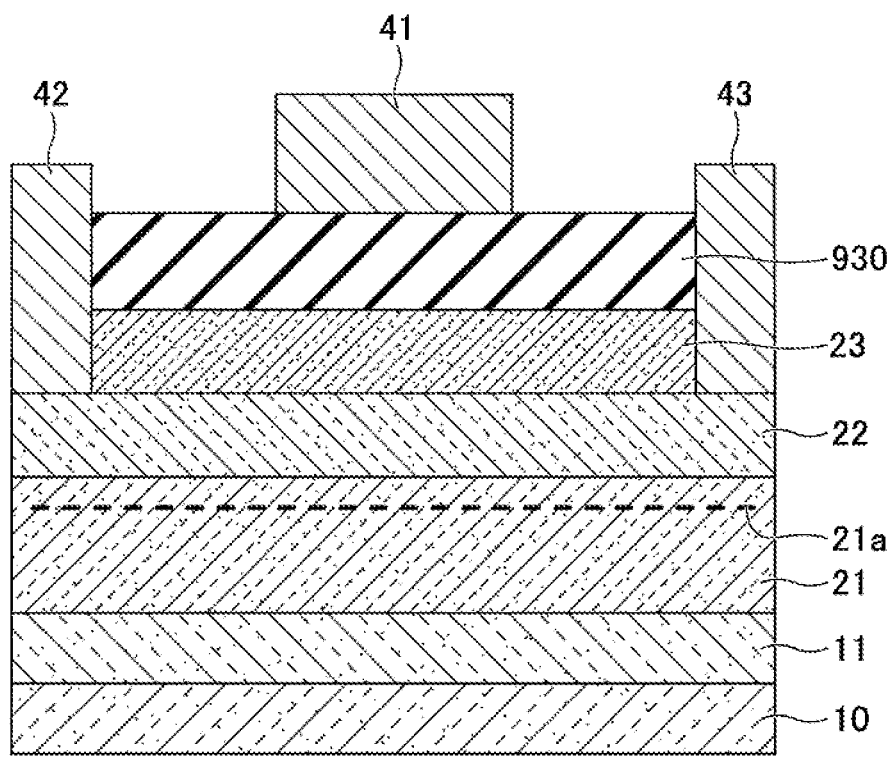
FIG. 5 illustrates a structure of a semiconductor device according to the first embodiment.
Figure 6A:
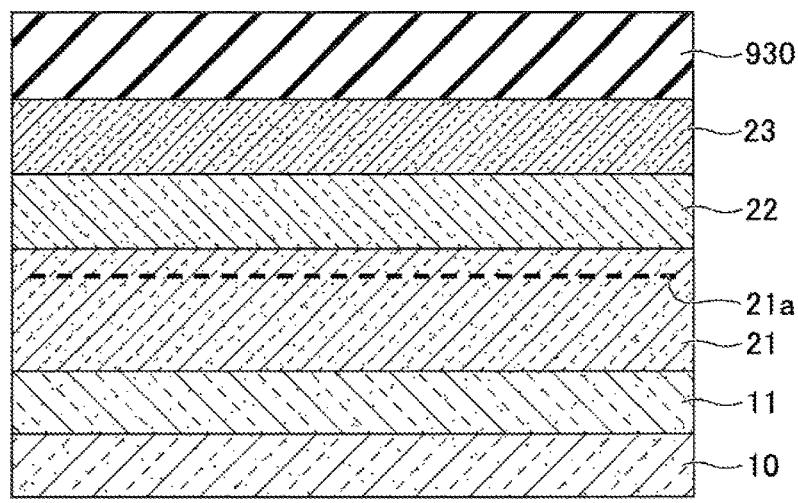
FIGS. 6A and 6B illustrate structures of samples 6A and 6B corresponding to the structures of semiconductor devices.
Figure 6B:
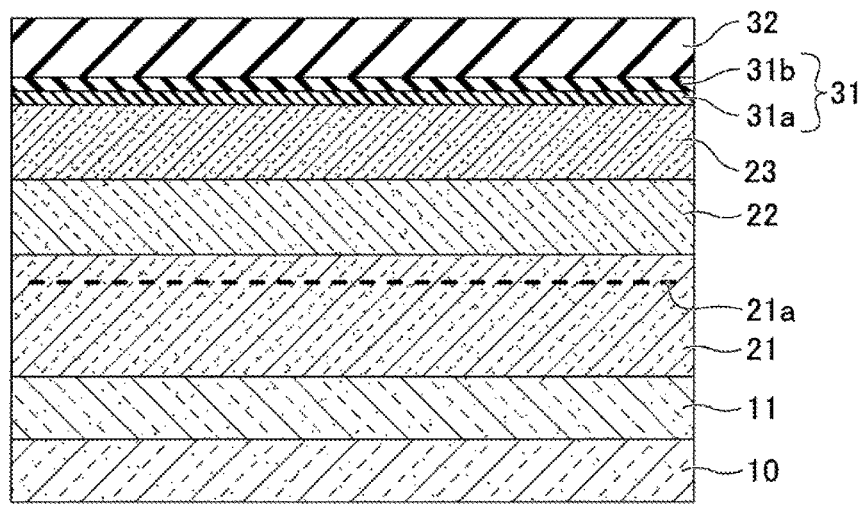

Thus, in the conventional semiconductor device illustrated in FIG. 5, a part of the cap layer 23 is oxidized, and electrons are likely to be trapped at this part. On the other hand, in the semiconductor device according to the present embodiment, the cap layer 23 is not oxidized, and therefore electrons are unlikely to be trapped. That is, in the conventional semiconductor device illustrated in FIG. 5, the insulating film 930 is formed of $Al_2O_3$, and part of the cap layer 23 near the interface between the insulating film 930 and the cap layer 23 becomes oxidized, and electrons are likely to be trapped at this part. Therefore, the threshold variation increases in the conventional semiconductor device. On the other hand, in the semiconductor device according to the present embodiment, the cap layer 23 is in contact with the $Si_3N_4$ film 31a of the first insulating film 31. Therefore, the cap layer 23 will not become oxidized, and electrons are unlikely to be trapped. Therefore, the threshold variation is presumed to be little in the semiconductor device according to the present embodiment.

In the present embodiment, the first insulating film 31 is formed of a film in which a nitride film and an oxynitride film are deposited, and the second insulating film 32 is formed of an oxide film. Furthermore, the oxynitride film in the first insulating film 31 is a gradient composition film having a concentration gradient in which the oxygen concentration increases and the nitrogen concentration decreases, from the nitride film of the first insulating film 31 toward the second insulating film 32.

The oxynitride film in the first insulating film 31 is a film formed by oxynitriding a nitride film, and includes the same elements as a nitride film. Therefore, the combination of the nitride film and the oxynitride film in the first insulating film 31 may be an AlN film and an AlON film, other than the $Si_3N_4$ film and the SiON film described above. Furthermore, the second insulating film 32 preferably includes the same elements as the first insulating film 31, from the viewpoint of adherence and consistency. That is, when the first insulating film 31 is formed of a $Si_3N_4$ film and a SiON film, the second insulating film 32 is preferably a $SiO_2$ film. When the first insulating film 31 is formed of an AlN film and an AlON film, the second insulating film 32 is preferably an $Al_2O_3$ film.

Second Embodiment

Figure 11:
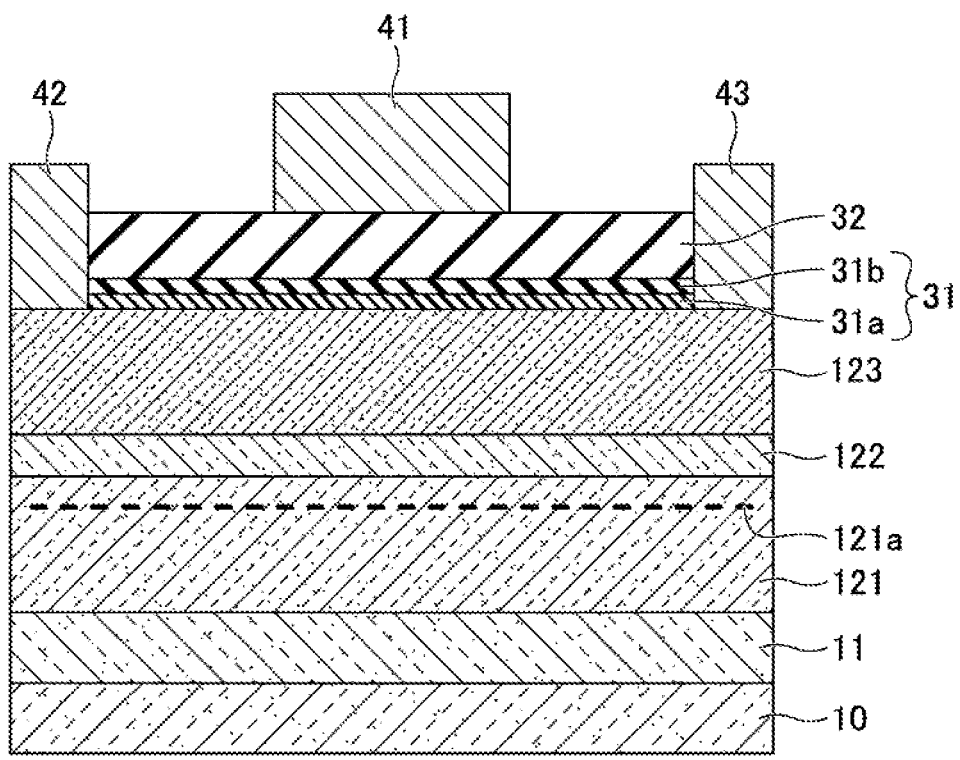
FIG. 11 illustrates a structure of a semiconductor device according to a second embodiment.

Next, a description is given of a semiconductor device according to a second embodiment. In the semiconductor device according to the present embodiment, as illustrated in FIG. 11, by the epitaxial growth of nitride semiconductors, the buffer layer 11, an electron transit layer 121, a spacer layer 122, and an electron supply layer 123 are deposited in a layered manner on the substrate 10. The source electrode 42 and the drain electrode 43 are formed on the electron supply layer 123. On the electron supply layer 123 between the source electrode 42 and the drain electrode 43, the first insulating film 31 and the second insulating film 32 are sequentially deposited in a layered manner, and the gate electrode 41 is formed on the second insulating film 32. Note that in the present embodiment, the electron transit layer 121 may be referred to as a first semiconductor layer and the electron supply layer 123 may be referred to as a second semiconductor layer.

The substrate 10 is formed of a semiconductor material such as SiC, etc. The buffer layer 11 is formed of AlN and GaN, etc., the electron transit layer 121 is formed of i-GaN, the spacer layer 122 is formed of i-AlN, and the electron supply layer 123 is formed of i-InAlN. Accordingly, in the electron transit layer 121, 2DEG 121a is generated near the interface between the electron transit layer 121 and the spacer layer 122.

In the present embodiment, the $Si_3N_4$ film 31a of the first insulating film 31 is formed on the electron supply layer 123, and $Si_3N_4$ is a nitride, and therefore the electron supply layer 123 is not directly in contact with an oxide film or an oxynitride film. Therefore, the i-InAlN forming the electron supply layer 123 will not become oxidized. Note that the electron supply layer 123 may be formed of i-InAlGaN.

Note that the contents other than the above are the same as those of the first embodiment.

Third Embodiment

Next, a description is given of a manufacturing method of a semiconductor device according to a third embedment. The present embodiment is a manufacturing method of the semiconductor device according to the third embodiment, and is a different manufacturing method from that of the first embodiment.

Figure 12A:
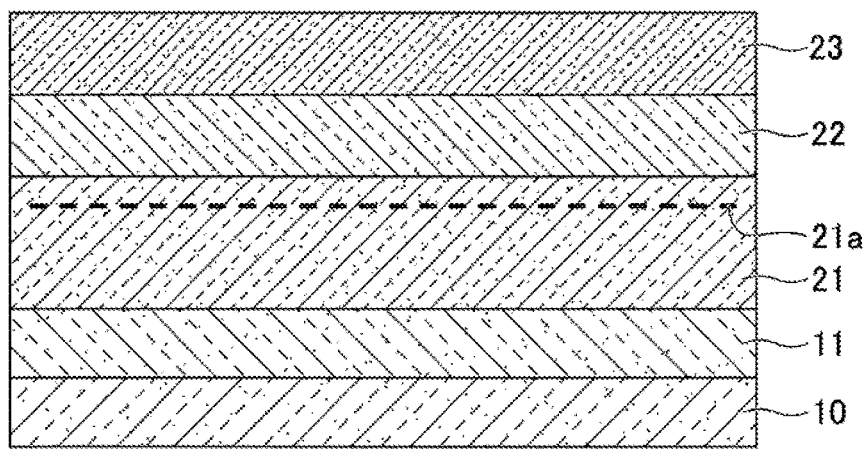
FIGS. 12A and 12B are process drawings of a method of manufacturing the semiconductor device according to a third embodiment.

First, as illustrated in FIG. 12A, by epitaxially growing nitride semiconductor layers, the buffer layer 11, the electron transit layer 21, the electron supply layer 22, and the cap layer 23 are formed on the substrate 10. Accordingly, the 2DEG 21a is generated in the electron transit layer 21, near the interface between the electron transit layer 21 and the electron supply layer 22.

Figure 12B:
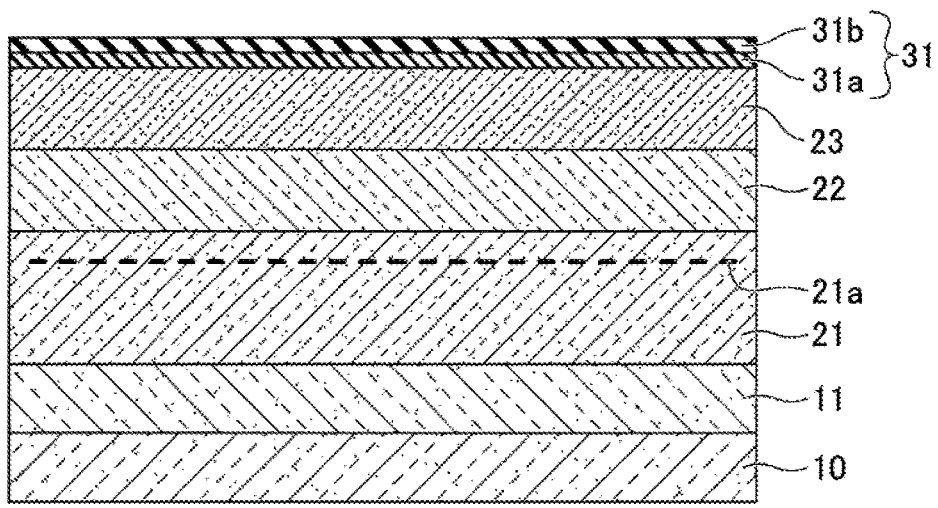

Next, as illustrated in FIG. 12B, the first insulating film 31 is formed on the cap layer 23, etc. The first insulating film 31 is formed by forming a silicon nitride film on the cap layer 23, and then performing an oxygen plasma process. Accordingly, the first insulating film 31 is formed by the $Si_3N_4$ film 31a formed on the cap layer 23, and the SiON film 31b formed on the $Si_3N_4$ film 31a. The film thickness of the first insulating film 31 is approximately 5 nm, and the SiON film 31b is a gradient composition film in which the oxygen concentration increases toward the surface of the SiON film 31b.

Figure 13A:
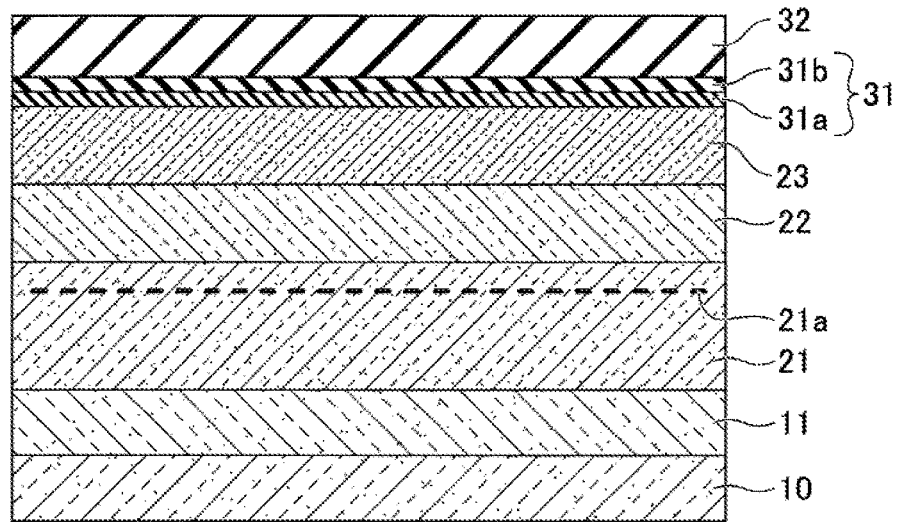
FIGS. 13A and 13B are process drawings of a method of manufacturing the semiconductor device according to the third embodiment.

Next, as illustrated in FIG. 13A, an $Al_2O_3$ film having a film thickness of 2 nm through 100 nm, for example, 35 nm, is formed on the first insulating film 31, to form the second insulating film 32. Subsequently, heat treatment is performed at a temperature of 500° C. through 800° C.

Figure 13B:
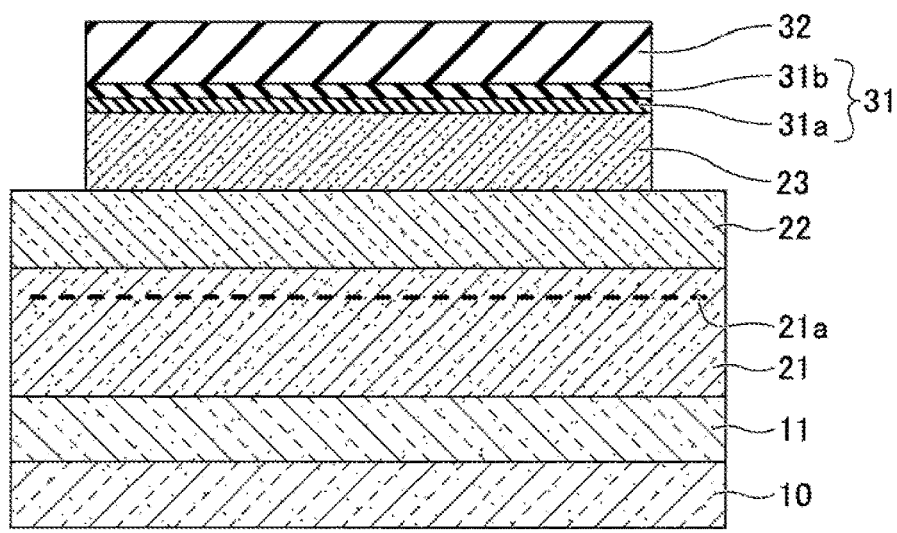

Next, as illustrated in FIG. 13B, the second insulating film 32, the first insulating film 31, and the cap layer 23 are removed, by dry etching, from the areas where the source electrode 42 and the drain electrode 43 are to be formed, and the electron supply layer 22 is exposed.

Figure 14A:
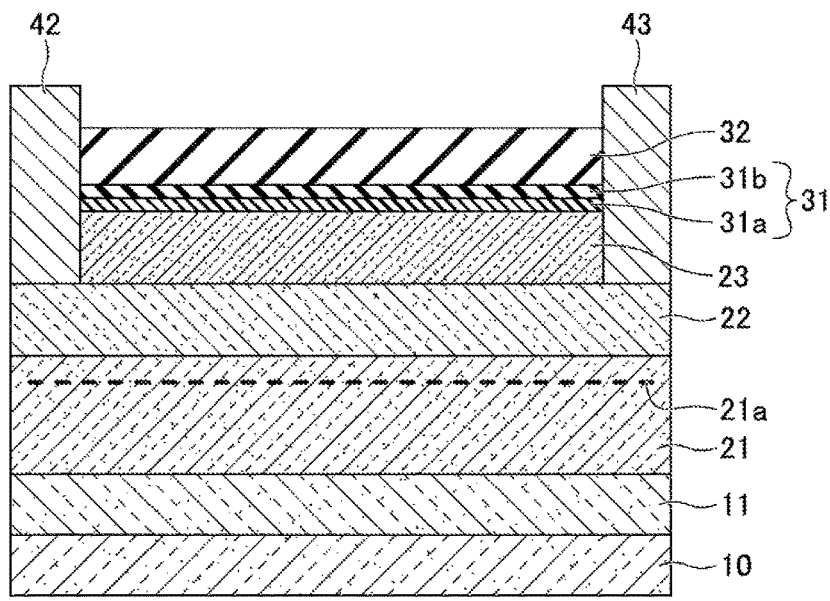
FIGS. 14A and 14B are process drawings of a method of manufacturing the semiconductor device according to the third embodiment.

Next, as illustrated in FIG. 14A, on the exposed electron supply layer 22, the source electrode 42 and the drain electrode 43 are formed. Subsequently, by performing heat treatment at a temperature of approximately 550° C., the source electrode 42 and the drain electrode 43 are caused to come in ohmic contact with each other.

Figure 14B:
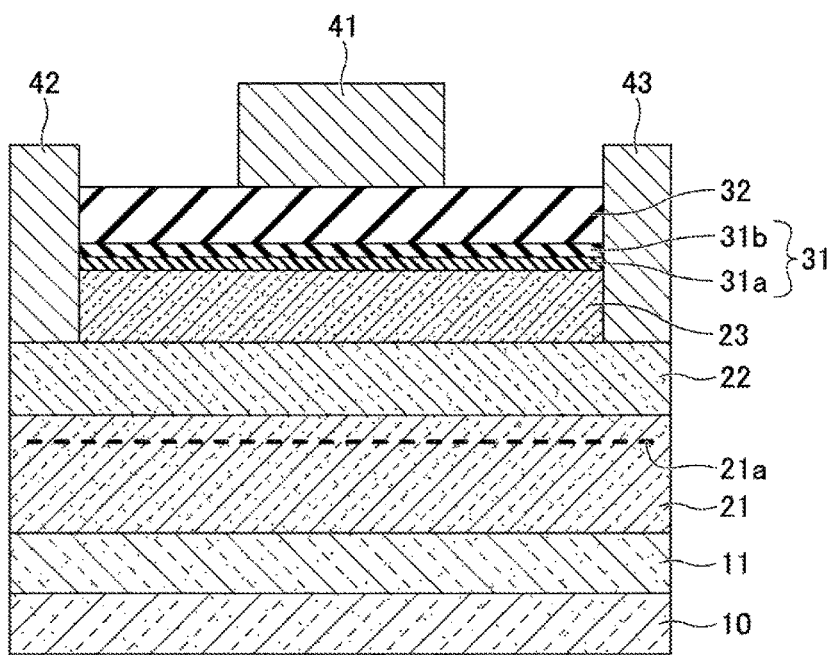

Next, as illustrated in FIG. 14B, the gate electrode 41 is formed on the second insulating film 32. Subsequently, heat treatment is performed at a temperature of approximately 300° C. through 400° C., and furthermore, a protection film (not illustrated), etc., is formed with an insulating material.

According to the above processes, the semiconductor device according to the present embodiment is manufactured.

Note that the contents other than the above are the same as those of the first embodiment.

Fourth Embodiment

Next, a description is given of a fourth embodiment. The present embodiment is relevant to a semiconductor device, a power unit, and a high-frequency amplifier.

Figure 15:
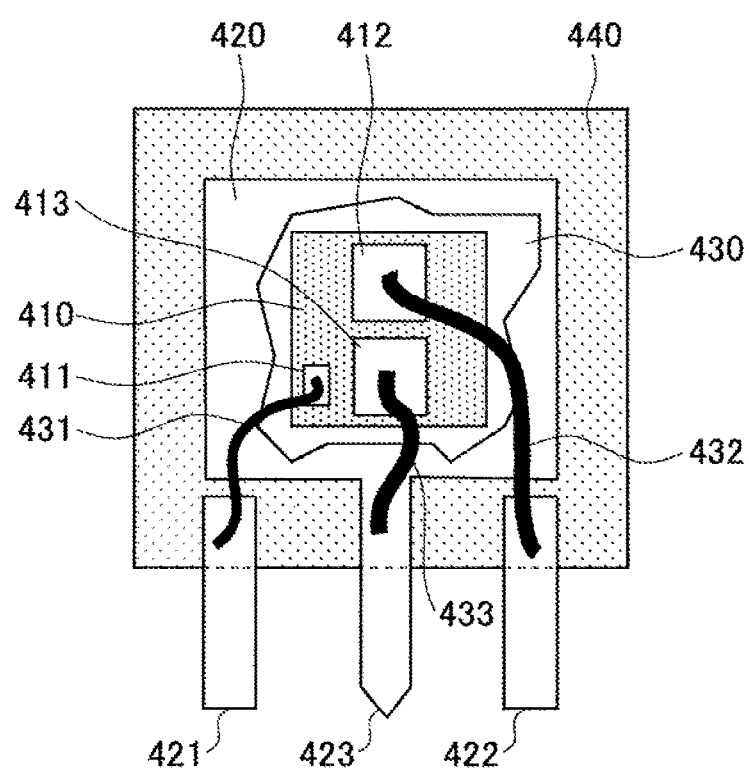
FIG. 15 illustrates a discretely packaged semiconductor device according to a fourth embodiment.

The semiconductor device according to the present embodiment is formed by discretely packaging the semiconductor device according to the first embodiment or the second embodiment. A description is given of this discretely packaged semiconductor device with reference to FIG. 15. FIG. 15 schematically illustrates the inside of the discretely packaged semiconductor device, and the locations of electrodes are different from those of the first embodiment or the second embodiment.

First, the semiconductor device manufactured according to the first embodiment or the second embodiment is cut by dicing, and a semiconductor chip 410 that is a HEMT, etc., made of a GaN system material is formed. The semiconductor chip 410 is fixed on a lead frame 420 by a diatouch agent 430 such as solder. Note that the semiconductor chip 410 corresponds to the semiconductor device according to the first embodiment or the second embodiment.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 are formed by a metal material such as Al. Furthermore, in the present embodiment, the gate electrode 411 is a gate electrode pad, which is connected to the gate electrode 41 of the semiconductor device according to the first embodiment or the second embodiment. Furthermore, the source electrode 412 is a source electrode pad, which is connected to the source electrode 42 of the semiconductor device according to the first embodiment or the second embodiment. Furthermore, the drain electrode 413 is a drain electrode pad, which is connected to the drain electrode 43 of the semiconductor device according to the first embodiment or the second embodiment.

Next, resin sealing is performed with mold resin 440 by a transfer mold method. As described above, a discretely packaged semiconductor chip that is a HEMT, etc., made of a GaN system material is manufactured.

Next, a description is given of a power unit and a high-frequency amplifier according to the present embodiment. The power unit and the high-frequency amplifier according to the present embodiment use the semiconductor device according to the first embodiment or the second embodiment.

Figure 16:
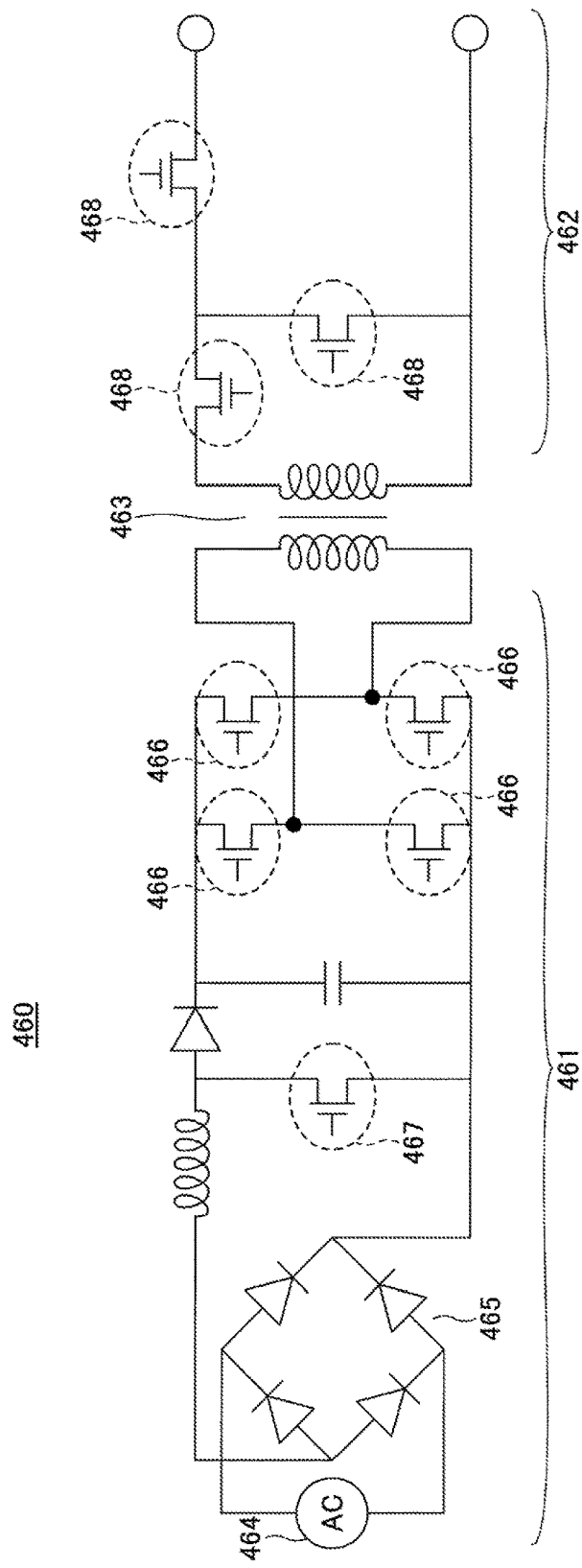
FIG. 16 is a circuit diagram of a power unit according to the fourth embodiment.

First, with reference to FIG. 16, a description is given of the power unit according to the present embodiment. A power unit 460 according to the present embodiment includes a high voltage primary side circuit 461, a low voltage secondary side circuit 462, and a transformer 463 disposed between the high voltage primary side circuit 461 and the low voltage secondary side circuit 462. The high voltage primary side circuit 461 includes an AC (alternating-current) source 464, a so-called bridge rectifier circuit 465, plural switching elements (four in the example of FIG. 16) 466, and one switching element 467. The low voltage secondary side circuit 462 includes plural switching elements 468 (three in the example of FIG. 16). In the example of FIG. 16, the semiconductor device according to the first embodiment or the second embodiment is used as the switching elements 466 and the switching element 467 of the high voltage primary side circuit 461. The switching elements 466 and 467 of the high voltage primary side circuit 461 are preferably normally-off semiconductor devices. Furthermore, switching elements 468 used in the low voltage secondary side circuit 462 are typical MISFET (Metal Insulator Semiconductor Field Effect Transistor) made of silicon.

Figure 17:
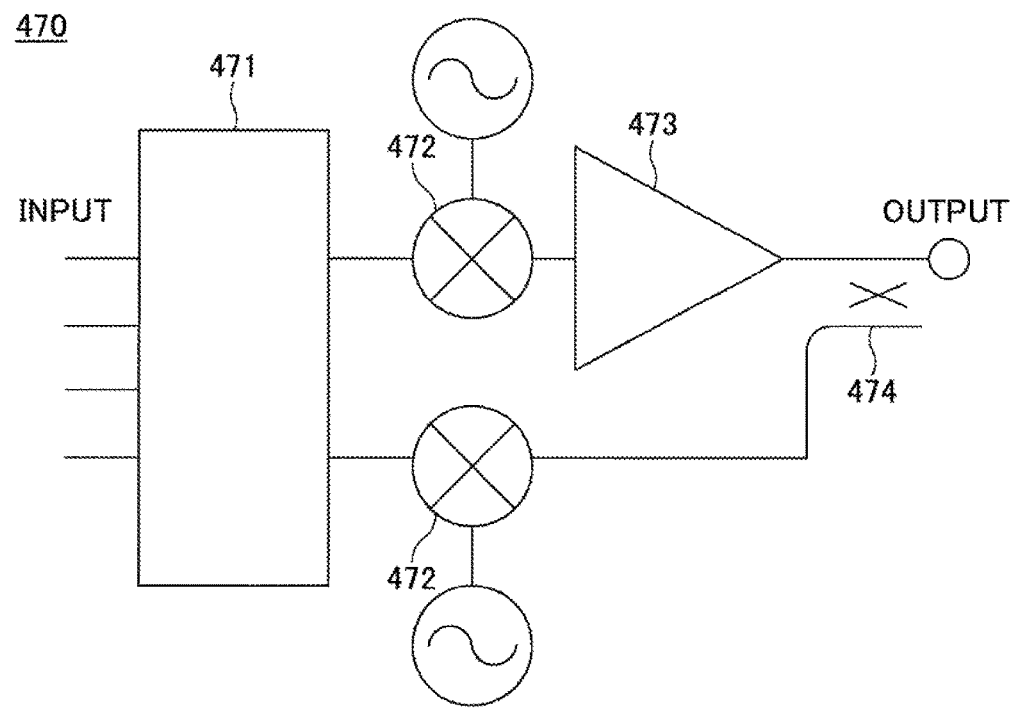
FIG. 17 illustrates a high-frequency amplifier according to the fourth embodiment.

Next, with reference to FIG. 17, a description is given of the high-frequency amplifier according to the present embodiment. A high-frequency amplifier 470 according to the present embodiment may be applied to a power amplifier of a base station of mobile phones. The high-frequency amplifier 470 includes a digital predistortion circuit 471, mixers 472, a power amplifier 473, and a directional coupler 474. The digital predistortion circuit 471 offsets the non-linear strains of input signals. The mixers 472 mix the input signals, whose non-linear strains have been offset, with AC signals. The power amplifier 473 amplifies the input signals that have been mixed with the AC signals. In the example of FIG. 17, the power amplifier 473 includes the semiconductor device according to the first embodiment or the second embodiment. The directional coupler 474 monitors input signals and output signals. In the circuit of FIG. 17, for example, the switch may be switched so that output signals are mixed with AC signals by the mixers 472 and sent to the digital predistortion circuit 471.

According to an aspect of the embodiments, in a semiconductor device using nitride semiconductors, a gate leakage current can be suppressed and threshold variation is reduced.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
a first semiconductor layer made of a nitride semiconductor and formed on a substrate;
a second semiconductor layer made of a nitride semiconductor and formed on the first semiconductor layer;
a source electrode and a drain electrode formed on the second semiconductor layer;
a first insulating film formed on the second semiconductor layer;
a second insulating film formed on the first insulating film; and
a gate electrode formed on the second insulating film,
wherein the first insulating film includes a nitride film formed on a side of the second semiconductor layer, and an oxynitride film formed on the nitride film,
the second insulating film is made of an oxide, and
the second insulating film includes a top surface contacting the gate electrode formed on the second insulating film, and a bottom surface contacting the oxynitride film over an entire surface area of the first insulating film.

2. The semiconductor device according to claim 1, wherein the oxynitride film is a gradient composition film in which oxygen increases from a side of the nitride film toward a side of the second insulating film.

3. The semiconductor device according to claim 1, wherein a film thickness of the second insulating film is greater than a film thickness of the first insulating film.

4. The semiconductor device according to claim 1, wherein a film thickness of the first insulating film is greater than or equal to 3 nm and less than or equal to 20 nm.

5. The semiconductor device according to claim 1, wherein the first insulating film is made of a nitride and an oxynitride including Si or Al.

6. The semiconductor device according to claim 1, wherein the second insulating film is made of the oxide including any one of Si, Al, Hf, and Ta.

7. The semiconductor device according to claim 1, wherein the first insulating film and the second insulating film both include Si, or the first insulating film and the second insulating film both include Al.

8. The semiconductor device according to claim 1, wherein the first insulating film is made of a nitride of Si and an oxynitride of Si, and the second insulating film is made of the oxide including Al.

9. The semiconductor device according to claim 1, wherein the first semiconductor layer is made of a material including GaN, and the second semiconductor layer is made of a material including any one of AlGaN, InAlN, and InAlGaN.

10. The semiconductor device according to claim 1, wherein
a cap layer that is made of a material including GaN is formed on the second semiconductor layer, and
the first insulating layer is formed on the cap layer.

11. The semiconductor device according to claim 1, wherein a spacer layer that is made of a nitride semiconductor is formed between the first semiconductor layer and the second semiconductor layer.

12. A method of manufacturing a semiconductor device, the method comprising:
forming a first semiconductor layer on a substrate, by a nitride semiconductor;
forming a second semiconductor layer on the first semiconductor layer, by a nitride semiconductor;
forming a first insulating film that is made of a nitride film and an oxynitride film, on the second semiconductor layer;
forming a second insulating film on the first insulating film, by an oxide;
forming a source electrode and a drain electrode on the second semiconductor layer; and
forming a gate electrode on the second insulating film,
wherein the forming of the source electrode and the drain electrode is performed after the forming of the second insulating film, and includes performing heat treatment to cause the source electrode and the drain electrode to come in ohmic contact with each other,
the forming of the second insulating film includes performing heat treatment after forming the second insulating film, and
a temperature at which the heat treatment is performed after forming the second insulating film is higher than a temperature at which the heat treatment is performed for causing the ohmic contact.

13. The method according to claim 12, wherein the forming of the first insulating film includes
forming the nitride film on the second semiconductor layer, and
forming the oxynitride film by oxidizing a surface of the nitride film.

14. The method according to claim 13, wherein the oxynitride film is formed by oxidizing the surface of the nitride film by performing an oxygen plasma process.

15. The method according to claim 12, wherein a film thickness of the first insulating film is greater than or equal to 3 nm and less than or equal to 20 nm.

16. The method according to claim 12, wherein the first insulating film is made of a nitride and an oxynitride including Si or Al.

17. The method according to claim 12, wherein
the first semiconductor layer is made of a material including GaN, and
the second semiconductor layer is made of a material including any one of AlGaN, InAlN, and InAlGaN.

18. A power unit comprising:
the semiconductor device according to claim 1.

19. An amplifier comprising:
the semiconductor device according to claim 1.

* * * * *